US012720675B2

(12) United States Patent
Zinn et al.

(10) Patent No.: US 12,720,675 B2
(45) Date of Patent: Aug. 25, 2026

(54) METAL-COATED SUBSTRATES, INTERPOSERS, AND METHODS FOR PRODUCTION THEREOF

(71) Applicant: Kuprion Inc., Waterbury, CT (US)

(72) Inventors: Alfred A. Zinn, San Jose, CA (US); Alex Capanzana, San Jose, CA (US); Hannah Thanh Zinn, Palo Alto, CA (US)

(73) Assignee: Kuprion Inc., Waterbury, CT (US)

( * ) Notice: Subject to any disclaimer, the term of this patent is extended or adjusted under 35 U.S.C. 154(b) by 212 days.

(21) Appl. No.: 18/837,688

(22) PCT Filed: Feb. 15, 2023

(86) PCT No.: PCT/US2023/062673
§ 371 (c)(1),
(2) Date: Aug. 12, 2024

(87) PCT Pub. No.: WO2023/159076
PCT Pub. Date: Aug. 24, 2023

(65) Prior Publication Data

US 2025/0185156 A1 Jun. 5, 2025

Related U.S. Application Data

(60) Provisional application No. 63/311,556, filed on Feb. 18, 2022.

(51) Int. Cl.
*H10W 70/66* (2026.01)
*H05K 1/02* (2006.01)
(Continued)

(52) U.S. Cl.
CPC ......... *H05K 1/0271* (2013.01); *H05K 1/0306* (2013.01); *H05K 1/0313* (2013.01);
(Continued)

(58) Field of Classification Search
CPC ... H10W 70/60; H10W 70/695; H10W 70/05; H10W 70/692; H10W 70/66;
(Continued)

(56) References Cited

U.S. PATENT DOCUMENTS 7,629,017 B2 * 12/2009 Kodas .................... H05K 3/105 427/256
8,257,795 B2 * 9/2012 Lu ........................... B22F 7/064 427/383.1
(Continued)

FOREIGN PATENT DOCUMENTS

EP 2544515 A1 1/2013
JP H07288296 A 10/1995
(Continued)

*Primary Examiner* — Timothy J Thompson
*Assistant Examiner* — Michael F Mcallister
(74) *Attorney, Agent, or Firm* — Carmody Torrance Sandak & Hennessey LLP

(57) ABSTRACT

Substrates may be metallized by introducing a seed layer upon a base substrate, mechanically polishing the seed layer, and forming a metal layer upon the seed layer after mechanical polishing. The base substrate may comprise a ceramic, such as silicon nitride or aluminum nitride, a polymer, silicon, metal, or glass. The seed layer optionally may be rendered electrically conductive by mechanical polishing of an initially non-conductive seed layer. The metal layer may be formed by depositing a metal nanoparticle composition upon the seed layer after mechanical polishing and consolidating metal nanoparticles therein, such as through a hot pressing operation. The metal nanoparticle composition may contain one or more additives that facilitate CTE matching of the metal layer to the base substrate.

26 Claims, 2 Drawing Sheets

(51) Int. Cl.

| | |
|---|---|
| ***H05K 1/03*** | (2006.01) |
| ***H05K 3/38*** | (2006.01) |
| ***H10W 70/05*** | (2026.01) |
| ***H10W 70/692*** | (2026.01) |
| ***H10W 70/695*** | (2026.01) |

(52) U.S. Cl.

CPC ............ *H05K 3/388* (2013.01); *H10W 70/05* (2026.01); *H10W 70/66* (2026.01); *H10W 70/692* (2026.01); *H10W 70/695* (2026.01); *H05K 2201/0257* (2013.01); *H05K 2201/068* (2013.01); *H05K 2203/025* (2013.01); *H05K 2203/1105* (2013.01)

(58) Field of Classification Search

CPC .. H05K 1/0271; H05K 1/0306; H05K 1/0313; H05K 1/097; H05K 3/181; H05K 3/188; H05K 3/388; H05K 2201/0236; H05K 2201/0257; H05K 2201/068; H05K 2203/025; H05K 2203/1105; H05K 2203/1131

USPC .......................................................... 174/256

See application file for complete search history.

(56) References Cited

U.S. PATENT DOCUMENTS

| | | | | |
|---|---|---|---|---|
| 8,900,704 | B1 * | 12/2014 | Zinn | H10W 40/258 361/708 |
| 2006/0088705 | A1 * | 4/2006 | Mitsumori | C23C 18/1889 428/209 |
| 2006/0163740 | A1 | 7/2006 | Ohno et al. | |
| 2009/0096100 | A1 * | 4/2009 | Kajiwara | H10W 70/481 252/512 |
| 2013/0251900 | A1 * | 9/2013 | Zinn | C04B 41/88 264/603 |
| 2013/0256014 | A1 | 10/2013 | Takahashi et al. | |
| 2014/0242362 | A1 | 8/2014 | Nakako et al. | |
| 2021/0014978 | A1 * | 1/2021 | Hashizume | H05K 3/022 |
| 2021/0127487 | A1 | 4/2021 | Aikawa et al. | |

FOREIGN PATENT DOCUMENTS

| | | | |
|---|---|---|---|
| JP | H0888453 | A | 4/1996 |
| JP | 2013040055 | A | 2/2013 |

* cited by examiner

METAL-COATED SUBSTRATES, INTERPOSERS, AND METHODS FOR PRODUCTION THEREOF

BACKGROUND

Modern electronic assemblies contain numerous interconnects between the various board components. The purpose of a given interconnect may be thermal, electrical, or structural in nature. Conventional interconnects are usually made from epoxies or tin- and/or lead-based solders due to their relatively low processing temperatures, and low material and processing costs. Unfortunately, these materials are not ideally suited for a number of applications, especially new high-performance electronics with large heat burdens, and current interconnects may exhibit several drawbacks and limitations as a result.

Most electronics made today are fabricated using printed circuit board (PCB) technology, which may include a number of interconnects therein. The term "printed circuit board" is somewhat of a misnomer, given that most boards are not truly printed and instead utilize photolithography to pattern a desired conductive circuit pattern (conductive traces) from a copper sheet bonded to a substrate. The copper sheet is first bonded to FR4 or a similar glass fiber epoxy laminate, and then much of the copper is etched away to leave behind one or more conductive traces upon the substrate in a desired pattern. Up to 90% of the copper sheet may be etched away in this process. Although the etched copper may be recovered, the etching process is time-consuming, labor-intensive, and may produce excessive quantities of hazardous waste. Most printed circuit boards are multi-layered, and this process needs to be repeated for each board layer. As a further complication, the low thermal conductivity of glass fiber epoxy substrates may be problematic in various respects. While other types of substrates are of interest, processing issues regarding these alternative substrates have not yet been universally resolved. In a particular example, coefficient of thermal expansion (CTE) mismatch between the substrate and other components in an electrical interconnect, including heat dissipation systems, may be problematic, as discussed further below.

Ongoing demands for reduced chip sizes, increased functionality, and improved performance, all on a smaller footprint, are continuing to drive the need for heterogeneous integration in modern microelectronics components and systems. These developments are being facilitated by various packaging and electrical interconnect technologies such as wafer level fan out (WLFO), embedded multi-die interconnect bridge (EMIB), and interposer technologies. Interposers continue to be important for advanced electronic systems such as, for example, 2.5D and 3D integrated circuit and system-in-package (SIP) applications, given the proven benefits of interposers having through-surface vias (TSV).

Interposers are becoming increasingly prevalent as components (e.g., incorporated within system-in-package (SIP) and system-on-chip (SOC) configurations) within printed circuit boards to establish electrical and/or thermal communication between the various electronic components therein. Interposers commonly used for packaging applications fall into three main categories: silicon, organics (polymers), and glass. Each of these interposer material classes faces its own challenges with respect to electrical, mechanical, and thermal properties for producing high-performance electronic devices. Namely, like other types of interconnects presently used in printed circuit boards, there are issues associated with current classes of interposers, such as limited thermal conductivity and/or poor bonding to metallic components. CTE (coefficient of thermal expansion) mismatch at one or more interconnects may lead to thermomechanical stress during repeated heating and cooling cycles as well. For interposers having a large surface area, the effects of CTE mismatch may be especially problematic.

Silicon interposers have long played a key role in 2.5D and 3D IC chip integration due to their high fine pitch density and TSV formation capabilities. Silicon is a proven technology, has been commercially used in a number of high-performance computing systems, and is currently favored in platforms using heterogeneous integration. However, silicon technology faces performance limitations caused by the TSV profile and microfluidic thermal design changes resulting from the need to mitigate thermal issues. High cost is another key challenge to overcome for continued adoption in the marketplace. For example, when used in a device, silicon interposers can add as much as $30 for a medium-sized chip or even over $100 for a larger-sized chip. Cost considerations have limited silicon interposers to high-speed networking and server chip applications where cost is less of a driver.

Organic interposers are one alternative being explored to reduce cost, as well as provide a favorably low dielectric constant. Organic interposers offer lower material costs and feature a well-established supply chain, as well as the ability to be manufactured using traditional processes such as wet etching. The main challenge of organic interposers lies in their limited stiffness, especially for very thin substrates. Organic interposers also lack the ability to achieve the fine pitch density possible with silicon and glass interposers. Organic interposers are currently well suited for applications such as, for example, logic-memory integration, large central processing units (CPUs)/graphics processing units (GPUs), high-performance RF applications, and certain types of application specific integrated chips (ASICs), although they are also usable in other applications in some instances.

Glass interposers are a logical low-cost, high-performance alternative interposer technology promising higher interconnect density than organic interposers and a significantly lower cost compared to silicon interposers with similar interconnect density. Therefore, glass interposers are seeing an increased adoption rate in ultra-high pitch density applications, such as, for example, in communications, network and signal processing and testing, high-bandwidth memory (HBM), high-performance computing, and radio frequency (RF) technology. In addition, glass interposers are being increasingly adopted in low-cost packaging such as, for example, micro-electromechanical systems (MEMS), sensors, power, and analog devices. In addition to their lower costs, glass interposers are also available in large panel forms. The key challenges associated with glass interposers include surface defects during manufacturing that can lead to cracking and low thermal conductivity. In addition, there are limitations in effective diameter achievable for through glass vias (TGV) due to large CTE mismatches of glass with conductive materials like copper, thereby effectively precluding the use of larger vias. Still, glass interposers promise to be a readily available solution for addressing current and future needs in the electronics industry.

With the proliferation of developments such as the Internet of Things (IoT), connected and self-driving cars, and similar devices, the push for high-bandwidth data processing and communications in combination with high-performance electronic systems has become increasingly important.

Although interposers may find use in a number of different types of electronic systems, the foregoing is a leading driver of the interposer market, since chip scaling has reached economical limits, and packaging has become a key focus for advancing electronics on a chip-scale. Continued growth of interposer technology is dependent on addressing challenges, performance, and cost barriers induced by the interposer materials themselves in these applications as well as others.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

DETAILED DESCRIPTION

Figure 1:
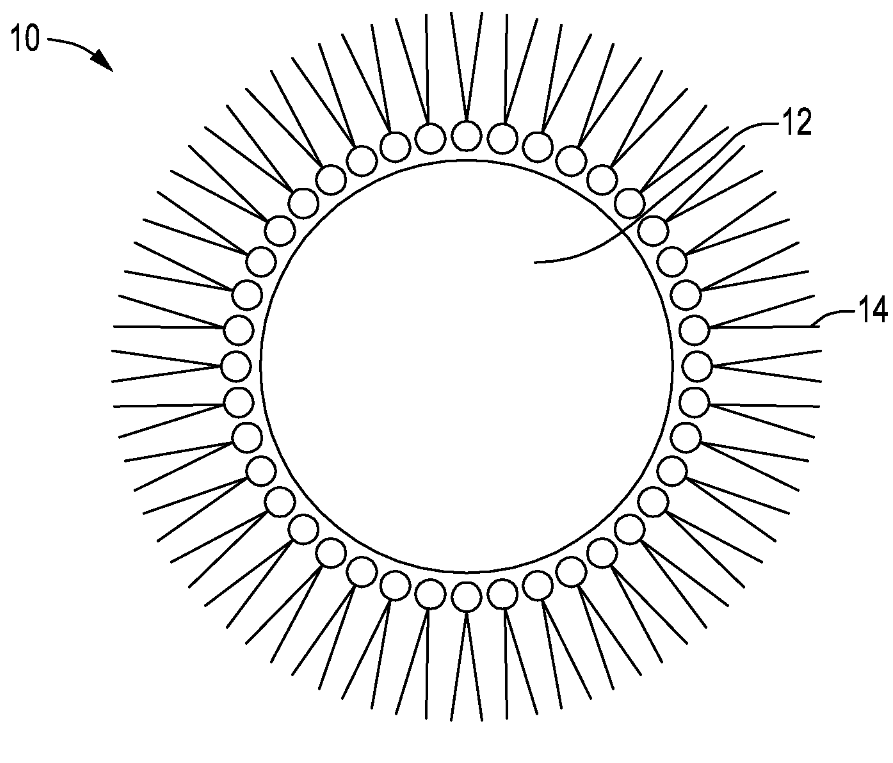
FIGS. 1 and 2 are diagrams of presumed structures of metal nanoparticles having a surfactant coating thereon.

The present disclosure is generally directed to electronic assemblies and, more specifically, metallized substrates of various types that are suitable for use in electronic assemblies.

There are multiple types of interconnects that may be present in a printed circuit board or similar type of electronic assembly, including within an interposer. Conventionally, interconnects are formed with epoxy or solder. Despite their common use, epoxies and solders have limitations that are oftentimes not readily overcome with conventional materials. Limited thermal conductivity, poor thermal stability, and CTE (coefficient of thermal expansion) mismatch may be problematic in many instances, for example, especially in high-performance electronic devices with significant heat burdens.

Ceramic substrates, such as non-conductive ceramic materials, would be desirable to incorporate in electronic assemblies as a result of their high thermal conductivity, excellent thermal stability, and good CTE match with many semiconductor materials. Aluminum nitride and silicon nitride are but two examples of ceramic materials that would be advantageous in this regard. However, direct metal bonding to such substrates may be problematic due to poor metal-ceramic adhesion. In addition, even when satisfactory metal adhesion may be achieved, CTE mismatch may still remain problematic. Similar issues may be encountered in other types of substrates beyond ceramics as well.

The present disclosure describes metallized substrates having a metal layer (metallization) bonded thereto by way of a seed layer, wherein the seed layer may be rendered electrically conductive through mechanical polishing. The seed layer may be formed in an initially non-conductive state upon a non-metallized (base) substrate and optionally rendered electrically conductive in a straightforward manner, after which a metal layer may be formed or deposited upon the seed layer, as described in greater detail hereinafter. Although particularly suitable and advantageous for ceramic substrates and glass substrates, both of which may be used in electronic assemblies of various types, the concepts disclosed herein may be applicable for other types of substrates as well, such as polymer substrates or silicon substrates. Illustrative examples of ceramic materials that may be metallized through application of the disclosure herein include, for example, aluminum oxide, aluminum nitride, silicon nitride, indium tin oxide, glass, silicon, and the like.

A seed layer may be formed on a specified substrate using an adhesive suitable for becoming adhered to a particular type of substrate surface. Examples are provided below. In particular, a substrate may first be coated with a thin layer of a seed layer precursor containing a non-conductive or low-conductivity matrix material and dispersed metal particles. The dispersed metal particles may be micron-size metal particles, metal nanoparticles, or any combination thereof. If metal nanoparticles in a metal nanoparticle paste formulation are used, the metal nanoparticle paste formulation may be blended with the non-conductive or low-conductivity matrix material, and the resulting blend may be co-cured together. Depending on the surface chemistry of the base substrate, the seed layer may contain the metal particles distributed in an epoxy adhesive or a liquid glass binder, which may readily adhere to the surface of the base substrate following curing. The as-deposited seed layer following curing (e.g., at 80-100° C. for 8-15 minutes) may be substantially an electrical insulator (electrically non-conductive) or very low conductivity by virtue of the metal particles remaining mostly isolated from one another. Although the as-deposited seed layer may be electrically non-conductive or low-conductivity, electrical conductivity surprisingly may be established by mechanically polishing the seed layer to form a polished seed layer prior to depositing a metal layer thereon. Establishing electrical conductivity within the seed layer by polishing may provide dual benefits. First, enhanced bonding of a metallization layer to the polished seed layer may be realized. Second, electrical conductivity of a conductive trace includes the combined conductivity of the seed layer and a metallization layer formed thereon. Thus, increasing the electrical conductivity of the seed layer may also increase the electrical conductivity of the resulting conductive trace. Finally, by rendering the seed layer electrically conductive, metallization strategies such as electroplating may be conducted, which may be satisfactory for forming a metallization layer in some instances (e.g., instead of forming a metal trace by consolidating metal nanoparticles). Electroless plating or consolidating metal nanoparticles to form a metallization layer, in contrast, may be conducted with the seed layer in either a conductive state or a non-conductive state.

Once the seed layer has been deposited and optionally rendered electrically conductive, the seed layer may be at least partially metallized to form a metal layer upon the seed layer. Metallization may take place by electroplating or electroless plating techniques, or more desirably using metal nanoparticle compositions. In contrast to plating techniques, metal nanoparticle compositions may be deposited and consolidated upon the seed layer to form either a thick metallization layer over substantially the entire surface of the seed layer or only in specified locations using direct printing techniques. Metallization layer thicknesses attainable by metal nanoparticle consolidation may range from as small as about 10 microns up to about 5000 microns (5 mm), or about 10 microns to about 500 microns, or about 500 microns to about 1000 microns, or about 1000 microns to about 3000 microns. Plating techniques may afford very thin metallization layer thicknesses, in contrast, such as layer thicknesses of about 50 microns or less, or about 10 microns or less. Direct printing techniques using metal nanoparticle compositions may afford conductive traces upon the surface of the substrate in specified locations, whereas etching techniques are limited to forming conductive traces by etching of the entirety of the metallization layer in specified locations. Electrical isolation between conductive traces may be realized by depositing the seed layer only in locations where conductive traces are to be formed and/or by etching the seed layer after forming conductive traces in desired locations to limit conductivity therebetween.

As described in further detail below, metal nanoparticle compositions may be processed at relatively low temperatures (~200° C.-250° C.) to form conductive traces or a metallization layer in accomplishing the foregoing. As a further advantage, metal nanoparticle compositions may be formulated to afford CTE matching with the seed layer and base substrate, thereby promoting more robust performance of the deposited metal layer and/or conductive traces. As a metal for the conductive traces, copper is desirable due to its low cost and high electrical conductivity, although other metals may be used as well. Copper and other highly conductive metals, including mixtures or alloys thereof, may be present as the metal particles in the seed layer as well. Mixtures or alloys containing copper may be advantageous for affording improved oxidation resistance, for example.

As described herein, low-temperature processing of metal nanoparticles, including copper nanoparticles, is made possible by the heightened activity of the metal nanoparticles compared to the corresponding bulk metal. As a result, metal nanoparticles may fuse (consolidate) together at a temperature much lower than the metal melting point to afford an at least partial metal layer upon the seed layer. Formation of the bulk metal may be accomplished at processing temperatures that would be incompatible with various electronics components if working with bulk metal directly in molten form. Once the metal nanoparticles have been fused together, properties similar to those of the corresponding bulk metal may be realized, but with the ability to tailor the CTE or other properties through formulation of the metal nanoparticle composition.

Before further discussing the embodiments of the present disclosure in further detail, a brief description of metal nanoparticles and metal nanoparticle compositions suitable for use in the present disclosure will first be provided, with copper nanoparticles being a representative example of metal nanoparticles that may be present as a majority metal nanoparticle in the metal nanoparticle compositions. Metal nanoparticles exhibit a number of properties that can differ significantly from those of the corresponding bulk metal. One property of metal nanoparticles that can be of particular importance is nanoparticle fusion or consolidation that occurs at the metal nanoparticles' fusion temperature. As used herein, the term "fusion temperature" refers to the temperature at which a metal nanoparticle liquefies, thereby giving the appearance of melting. As used herein, the terms "fusion," "sintering" and "consolidation" synonymously refer to the coalescence or partial coalescence of metal nanoparticles with one another to form a larger mass (sintered mass) of bulk metal, thereby defining a bulk metal matrix, such as bulk copper matrix. During nanoparticle fusion, the metal nanoparticles undergo consolidation to form the bulk metal matrix without proceeding through a liquid state.

Upon decreasing in size, particularly below about 200 nm in equivalent spherical diameter, the temperature at which metal nanoparticles coalesce drops dramatically from that of the corresponding bulk metal. For example, copper nanoparticles having a size of about 150 nm or less can have fusion temperatures of about 240° C. or below, or about 220° C. or below, or about 200° C. or below, in comparison to bulk copper's melting point of 1084° C. Some of the metal nanoparticles may be about 20 nm or less in size, which may have especially low fusion temperatures and promote consolidation of larger metal nanoparticles. Thus, the consolidation of metal nanoparticles taking place at the fusion temperature can allow objects containing a bulk metal matrix, such as one or more interconnects in an electronic assembly, a metal layer, and/or one or more conductive traces, to be fabricated at significantly lower processing temperatures than when working directly with the bulk metal itself as a starting material. Once the bulk metal matrix has been formed, the melting point of the bulk metal matrix resembles that of the bulk metal itself and contains a plurality of grain boundaries. In addition, the bulk metal matrix may have a defined nanoporosity that is not present within the corresponding bulk metal.

As used herein, the term "metal nanoparticle" refers to metal particles that are about 200 nm or less in size, without particular reference to the shape of the metal particles. As used herein, the term "copper nanoparticle" refers to a metal nanoparticle made from copper or predominantly copper.

As used herein, the term "micron-size metal particles" refers to metal particles that are about 250 nm or greater in size in at least one dimension, without particular reference to the shape of the metal particles.

The terms "consolidate," "consolidation" and other variants thereof are used interchangeably herein with the terms "fuse," "fusion" and other variants thereof.

As used herein, the terms "partially fused," "partial fusion," and other derivatives and grammatical equivalents thereof refer to the partial coalescence of metal nanoparticles with one another. Whereas totally fused metal nanoparticles retain essentially none of the structural morphology of the original unfused metal nanoparticles (i.e., they resemble bulk metal with minimal grain boundaries), partially fused metal nanoparticles retain at least some of the structural morphology of the original unfused metal nanoparticles. The properties of partially fused metal nanoparticles can be intermediate between those of the corresponding bulk metal and the original unfused metal nanoparticles.

A number of scalable processes for producing bulk quantities of metal nanoparticles in a targeted size range have been developed. Most typically, such processes for producing metal nanoparticles take place by reducing a metal precursor in the presence of one or more surfactants. The metal nanoparticles can then be isolated and purified from the reaction mixture by common isolation techniques and processed into a paste composition, if desired.

Any suitable technique can be employed for forming the metal nanoparticles used in the metal nanoparticle compositions and processes described herein. Particularly facile metal nanoparticle fabrication techniques are described in U.S. Pat. Nos. 7,736,414, 8,105,414, 8,192,866, 8,486,305, 8,834,747, 9,005,483, 9,095,898, and 9,700,940, each of which is incorporated herein by reference in its entirety. As described therein, metal nanoparticles can be fabricated in a narrow size range by reduction of a metal salt in a solvent in the presence of a suitable surfactant system, which can include one or more different surfactants. Further description of suitable surfactant systems follows below. Without being bound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to being at least partially fused together. Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, and glyme, diglyme, triglyme, and tetraglyme. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or tetraalkylammonium borohydrides).

Figure 2:
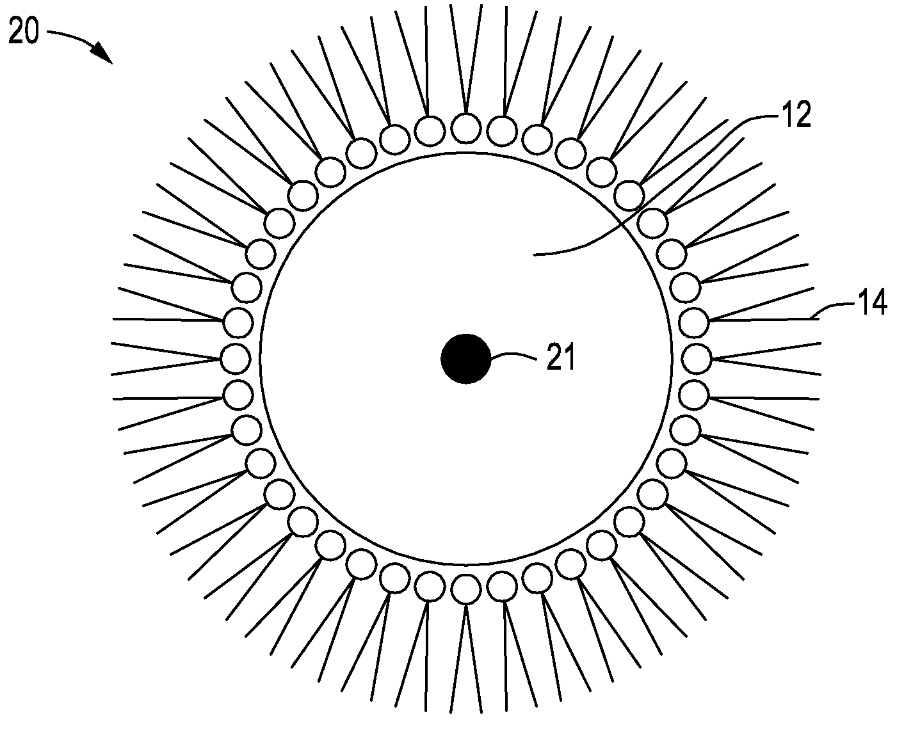

FIGS. 1 and 2 are diagrams of presumed structures of metal nanoparticles having a surfactant coating thereon. As shown in FIG. 1, metal nanoparticle 10 includes metallic core 12 and surfactant layer 14 overcoating metallic core 12. Surfactant layer 14 can contain any combination of surfactants, as described in more detail below. Metal nanoparticle 20, shown in FIG. 2, is similar to that depicted in FIG. 1, except metallic core 12 is grown about nucleus 21, which can be a metal that is the same as or different than that of metallic core 12. Because nucleus 21 is buried deep within metallic core 12 in metal nanoparticle 20, it is not believed to significantly affect the overall nanoparticle properties. In some embodiments, nucleus 21 may comprise a substance that is a grain growth inhibitor, which may be released as the metal nanoparticles undergo consolidation with one another. In some embodiments, the nanoparticles can have an amorphous morphology.

As discussed above, the metal nanoparticles have a surfactant coating containing one or more surfactants upon their surface. The surfactant coating can be formed on the metal nanoparticles during their synthesis. The surfactant coating is generally lost during consolidation of the metal nanoparticles upon heating above the fusion temperature. Formation of a surfactant coating upon metal nanoparticles during their syntheses can desirably limit the ability of the metal nanoparticles to fuse to one another before heating above the fusion temperature, limit agglomeration of the metal nanoparticles, and promote the formation of a population of metal nanoparticles having a narrow size distribution.

Copper can be a particularly desirable metal in the embodiments of the present disclosure due to its low cost, strength, and excellent electrical and thermal conductivity values, as well as additional advantages addressed further herein. Although copper nanoparticles may be advantageous for use in the embodiments herein, it is to be appreciated that other types of metal nanoparticles may be used in alternative embodiments. Other metal nanoparticles that may be useful in electronic applications for forming a bulk metal matrix include, for example, aluminum nanoparticles, palladium nanoparticles, silver nanoparticles, gold nanoparticles, iron nanoparticles, cobalt nanoparticles, nickel nanoparticles, titanium nanoparticles, zirconium nanoparticles, hafnium nanoparticles, tantalum nanoparticles, and the like. Micron-sized particles of these metals may be present in metal nanoparticle compositions containing the metal nanoparticles as well, which may provide processing advantages in some cases.

In various embodiments, the surfactant system present within the metal nanoparticles can include one or more surfactants. The differing properties of various surfactants can be used to tailor the properties of the metal nanoparticles. Factors that can be taken into account when selecting a surfactant or combination of surfactants for inclusion upon the metal nanoparticles can include, for example, ease of surfactant dissipation from the metal nanoparticles during nanoparticle fusion, nucleation and growth rates of the metal nanoparticles, the metal component of the metal nanoparticles, and the like.

In some embodiments, an amine surfactant or combination of amine surfactants, particularly aliphatic amines, can be present upon the metal nanoparticles. Amine surfactants can be particularly desirable for use in conjunction with copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure during synthesis versus having ready volatility and/or ease of handling during nanoparticle consolidation. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-hexylamine, n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but be readily dissociable therefrom during metal nanoparticle consolidation.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by any theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for inclusion upon metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N, N,N', N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N, N-diethylaniline, and the like. Other aromatic amines that can be used in conjunction with metal nanoparticles can be envisioned by one having ordinary skill in the art.

Suitable pyridines can include both pyridine and its derivatives. Illustrative pyridines that can be suitable for use inclusion upon metal nanoparticles include, for example, pyridine, 2-methylpyridine, 2,6-dimethylpyridine, collidine, pyridazine, and the like. Chelating pyridines such as bipyridyl chelating agents may also be used. Other pyridines that can be used in conjunction with metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be present upon metal nanoparticles include, for example, trimethylphosphine, triethylphosphine, tributylphophine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bisphosphines such as BINAP, for example. Other phosphines that can be used in conjunction with metal nanoparticles can be envisioned by one having ordinary skill in the art.

Suitable thiols can have a formula of RSH, where R is an alkyl or aryl group having from about 4 to about 16 carbon atoms. Illustrative thiols that can present upon metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with metal nanoparticles can be envisioned by one having ordinary skill in the art.

The metal nanoparticles described hereinabove can be incorporated within various metal nanoparticle compositions, which may facilitate dispensation thereof for forming a connection or metal layer of the present disclosure. Illustrative disclosure directed to such metal nanoparticle compositions follows hereinafter. Copper nanoparticle compositions may be particularly useful for forming a metal layer in the disclosure herein, especially in the presence of a grain growth inhibitor or CTE modifier for metal layers or components that may be exposed to high operating temperatures, particularly with repeated thermal cycling. The metal nanoparticle compositions may further be formulated to confer oxidation resistance within a metallization layer or conductive traces formed therefrom.

Metal nanoparticle compositions can be prepared by dispersing as-produced or as-isolated metal nanoparticles in an organic matrix containing one or more organic solvents and various other optional components. As used herein, the terms “nanoparticle paste formulation” and “nanoparticle paste composition” may be used interchangeably and refer synonymously to a fluid composition containing dispersed metal nanoparticles that is suitable for dispensation using a desired technique. The viscosity may vary over a wide range depending on the chosen dispensation technique. Use of the term “paste” does not necessarily imply an adhesive function of the paste alone. Through judicious choice of the organic solvent(s) and other additives, the loading of metal nanoparticles and the like, dispensation of the metal nanoparticles in a desired location may be promoted and the properties of a metal matrix (layer) resulting therefrom may be tailored.

Cracking and shrinkage can sometimes occur during consolidation of the metal nanoparticles within the metal nanoparticle compositions. One way in which the metal nanoparticle compositions can promote a decreased degree of cracking, shrinkage and void formation following metal nanoparticle consolidation is by maintaining a high solids content. More particularly, in some embodiments, the metal nanoparticle compositions can contain at least about 30% metal nanoparticles by weight, particularly about 30% to about 97% metal nanoparticles by weight of the composition, or about 50% to about 97% metal nanoparticles by weight of the composition, or about 70% to about 97% metal nanoparticles by weight of the composition. Moreover, in some embodiments, small amounts (e.g., about 0.01% to about 15% or about 35% or about 60% by weight of the composition) of micron-size metal particles can be present in addition to the metal nanoparticles. Such micron-size metal particles can desirably promote the fusion of metal nanoparticles into a contiguous mass and further reduce the incidence of cracking and shrinkage. Instead of being liquefied and undergoing direct consolidation, the micron-size metal particles can simply become joined together upon being contacted with metal nanoparticles that have been raised above their fusion temperature. Essentially, the metal nanoparticles may function like "glue" that joins the micron-size metal particles together. These factors can reduce the porosity after fusing the metal nanoparticles together, as well as provide tailoring of the CTE. The micron-size metal particles can include the same or different metals than the metal nanoparticles, and suitable metals for the micron-size particles can include, for example, copper, silver, gold, aluminum, tin, and the like. Micron-size graphite particles may also be included, in some embodiments. Carbon nanotubes and/or graphene may be included, in some embodiments. Still other additives in the micron-size range, such as diamond particles or cubic BN (boron nitride) may be included as well.

During consolidation, the copper matrix defined by fused copper nanoparticles is characterized by a very fine, uniformly distributed nanoporosity (typically 4-15% with a pore size in the range of about 100 nm to about 300 nm, and mostly closed pores) that limits hot spots by ensuring uniform heat distribution across an interface. However, the nanoporosity may range from about 2% to about 15% (i.e., 85%-98% dense fused copper nanoparticles or other types of fused nanoparticles with closed pore nanoporosity and a pore size ranging from about 50 nm to about 500 nm, or about 100 nm to about 300 nm, or about 150 nm to about 250 nm). Several copper bulk matrices described further below specify a bulk copper matrix having a density of at least 90%. However, it is to be appreciated that this value is representative of the density values that may be attained for the bulk copper matrices resulting from consolidation of copper nanoparticles and other types of metal nanoparticles, particularly a density ranging from about 85% to about 98%. Thus, the bulk copper matrices formed through consolidation of copper nanoparticles according to the disclosure herein may have a density ranging from about 85% to about 98% relative to bulk copper. The nanoporosity may reside within a similar range.

Micron-size metal particles may be differentiated from grain growth inhibitors in the disclosure herein, since micron-size metal particles are less readily incorporated within grain boundaries between consolidated metal nanoparticles due to their relatively large size. Particular examples of grain growth inhibitors or precursors thereto suitable for use in the present disclosure are discussed in further detail hereinbelow.

Decreased cracking and void formation during metal nanoparticle consolidation can also be promoted by judicious choice of the solvent(s) forming the organic matrix. A tailored combination of organic solvents can desirably decrease the incidence of cracking and void formation. More particularly, an organic matrix containing one or more hydrocarbons (saturated, monounsaturated, polyunsaturated (2 or more double bonds) or aromatic), one or more alcohols, one or more amines, and one or more organic acids can be especially effective for this purpose. One or more esters and/or one or more anhydrides may be included, in some embodiments. Without being bound by any theory or mechanism, it is believed that this combination of organic solvents can facilitate the removal and sequestration of surfactant molecules surrounding the metal nanoparticles during consolidation, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 5° C. to about 50° C. or about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In some embodiments, at least some of the one or more organic solvents can have a boiling point of about 100° C. or greater. In some embodiments, at least some of the one or more organic solvents can have a boiling point of about 200° C. or greater. In some embodiments, the one or more organic solvents can have boiling points ranging from about 50° C. to about 250° C. In other embodiments, the one or more organic solvents can have boiling points ranging from about 100° C. to about 350° C. or about 100° C. to about 370° C. Use of high boiling organic solvents can desirably increase the pot life of the metal nanoparticle compositions and limit the rapid loss of solvent, which can lead to cracking and void formation during metal nanoparticle consolidation. In some embodiments, at least one of the organic solvents can have a boiling point that is higher than the boiling point(s) of the surfactant(s) associated with the metal nanoparticles. Accordingly, surfactant(s) can be removed from the metal nanoparticles by evaporation before removal of the organic solvent(s) takes place.

In some embodiments, the organic matrix can contain one or more alcohols. In various embodiments, the alcohols can include monohydric alcohols, diols, triols, glycol ethers (e.g., diethylene glycol and triethylene glycol), alkanolamines (e.g., ethanolamine, triethanolamine, and the like), or any combination thereof. In some embodiments, one or more hydrocarbons can be present in combination with one or more alcohols. As discussed above, it is believed that alcohol and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), disopropyleneglycol monomethyl ether, diethyleneglycol diethyl ether, 2-propanol, 2-butanol, t-butanol, 1-hexanol, 2-(2-butoxyethoxy) ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present include, for example, tallowamine (CAS 61790-33-8), alkyl ($C_8$-$C_{18}$) unsaturated amines (CAS 68037-94-5), di(hydrogenated tallow) amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the nanoparticle paste compositions include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, $\alpha$-linolenic acid, stearidonic acid, oleic acid, and linoleic acid.

In some embodiments, the organic matrix can include more than one hydrocarbon, more than one alcohol, more than one amine, and more than one organic acid. For example, in some embodiments, each class of organic solvent can have two or more members, or three or more members, or four or more members, or five or more members, or six or more members, or seven or more members, or eight or more members, or nine or more members, or ten or more members. Moreover, the number of members in each class of organic solvent can be the same or different. Particular benefits of using multiple members of each class of organic solvent are described hereinafter.

One particular advantage of using multiple members within each class of organic solvent can include the ability to provide a wide spread of boiling points in the nanoparticle paste compositions. By providing a wide spread of boiling points, the organic solvents can be removed gradually as the temperature rises while affecting metal nanoparticle consolidation, thereby limiting volume contraction and disfavoring cracking. By gradually removing the organic solvent in this manner, less temperature control may be needed to affect slow solvent removal than if a single solvent with a narrow boiling point range was used. In some embodiments, the members within each class of organic solvent can have a window of boiling points ranging between about 50° C. and about 200° C., or between about 50° C. and about 250° C., or between about 100° C. and about 200° C., or between about 100° C. and about 250° C. Higher boiling solvents may be used as well. In more particular embodiments, the various members of each class of organic solvent can each have boiling points that are separated from one another by at least about 5° C., or at least about 10° C., or at least about 20° C., such as about 5° C. to about 25° C., or about 10° C. to about 35° C., or about 20° C. to about 50° C. More specifically, in some embodiments, each hydrocarbon can have a boiling point that differs by about 20° C. to about 50° C. from other hydrocarbons in the organic matrix, each alcohol can have a boiling point that differs by about 20° C. to about 50° C. from other alcohols in the organic matrix, each amine can have a boiling point that differs by about 20° C. to about 50° C. from other amines in the organic matrix, and each organic acid can have a boiling point that differs by about 20° C. to about 50° C. from other organic acids in the organic matrix. The more members of each class of organic solvent that are present, the smaller the differences become between the boiling points. By having smaller differences between the boiling points, solvent removal can be made more continual, thereby limiting the degree of volume contraction that occurs at each stage. A reduced degree of cracking can occur when four to five or more members of each class of organic solvent are present (e.g., four or more hydrocarbons, four or more alcohols, four or more amines, and four or more organic acids; or five or more hydrocarbons, five or more alcohols, five or more amines, and five or more organic acids), each having boiling points that are separated from one another within the above range.

In various embodiments, the metal nanoparticles used in the nanoparticle paste compositions can be about 20 nm or less in size. In some embodiments, suitable metal nanoparticles may be up to about 75 nm in size, up to about 100 nm in size, up to about 150 nm in size, or up to about 200 nm in size. As discussed above, metal nanoparticles in a size range of about 20 nm or below may have fusion temperatures that are significantly lower than those of the corresponding bulk metal and readily undergo consolidation with one another as a result. Accordingly, in at least some embodiments, metal nanoparticles about 20 nm or less in size may be combined with metal nanoparticles that are 20 nm or above in size to promote tailoring of the fusion temperature. In some embodiments, metal nanoparticles that are about 20 nm or less in size can have a fusion temperature of about 220° C. or below (e.g., a fusion temperature in the range of about 140° C. to about 220° C.) or about 200° C. or below, which can provide advantages that are noted above. In some embodiments, at least a portion of the metal nanoparticles can be about 10 nm or less in size, or about 5 nm or less in size. In some embodiments, at least a portion of the metal nanoparticles can range between about 1 nm in size to about 20 nm in size, or between about 1 nm in size and about 10 nm in size, or between about 1 nm in size to about 5 nm in size, or between about 3 nm in size to about 7 nm in size, or between about 5 nm in size to about 20 nm in size. Any of the foregoing size ranges may be combined with metal nanoparticles about 30 nm or larger in size, or about 50 nm or larger in size, or about 75 nm or larger in size, or about 100 nm or larger in size, or about 150 nm or larger in size. In some embodiments, substantially all of the metal nanoparticles can reside within these size ranges. In some embodiments, larger metal nanoparticles can be combined in the metal nanoparticle compositions with metal nanoparticles that are about 20 nm in size or less. For example, in some embodiments, metal nanoparticles ranging from about 1 nm to about 10 nm in size or about 5 nm to about 20 nm in size can be combined with metal nanoparticles that range from about 25 nm to about 50 nm in size, or with metal nanoparticles that range from about 25 nm to about 100 nm in size, or about 30 nm to about 80 nm in size. In other embodiments, smaller metal nanoparticles need not necessarily be present, and the metal nanoparticles may be about 30 nm or larger in size, or about 50 nm or larger in size, or about 75 nm or larger in size, or about 100 nm or larger in size, or about 150 nm or larger in size, such as within a size range of about 30 nm to about 100 nm, or about 75 nm to about 150 nm, or about 125 nm to about 200 nm. More efficient packing of the metal nanoparticles during consolidation may be realized by using metal nanoparticles in two different size ranges. As further discussed below, micron-size metal particles or nanoscale particles can also be included in the metal nanoparticle compositions in some embodiments. Although larger metal nanoparticles and micron-size metal particles may not be liquefiable at the low temperatures of their smaller counterparts, they can still become consolidated upon contacting the smaller metal nanoparticles that have formed a liquid-like state at or above their fusion temperature, as generally discussed above. When smaller metal nanoparticles and larger metal nanoparticles are used in combination with one another, the smaller and larger metal nanoparticles may be combined in any ratio.

In addition to metal nanoparticles and organic solvents, other additives can also be present in the nanoparticle paste compositions. Such additional additives can include, for example, rheology control aids, thickening agents, micron-size conductive additives, nanoscale conductive additives, CTE modifiers, and any combination thereof. Chemical additives can also be present. As discussed hereinafter, the inclusion of micron-size conductive additives, such as micron-size metal particles, can be particularly advantageous. Nanoscale or micron-size diamond or other thermally conductive additives may be desirable to include in some instances.

In some embodiments, the metal nanoparticle compositions can contain about 0.01% to about 15% micron-size metal particles by weight, or about 1% to about 10% micron-size metal particles by weight, or about 1% to about 5% micron-size metal particles by weight. Micron-size metal particles can also be present in the metal nanoparticle compositions in an amount of about 10% to about 35% by weight, or about 15% to about 35% by weight, or about 20% to about 35% by weight, or about 25% to about 35% by weight. Inclusion of micron-size metal particles in the metal nanoparticle compositions can desirably reduce the incidence of cracking that occurs during consolidation of the metal nanoparticles when forming a metal layer or conductive trace in the disclosure herein. Without being bound by any theory or mechanism, it is believed that the micron-size metal particles can become consolidated with one another as the metal nanoparticles form a liquid-like state and form a transient liquid coating upon the micron-size metal particles. In some embodiments, the micron-size metal particles can range between about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. The micron-size metal particles can contain the same metal as the metal nanoparticles or contain a different metal. Thus, metal alloys can be fabricated by including micron-size metal particles in the metal nanoparticle compositions with a metal differing from that of the metal nanoparticles. Suitable micron-size metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si and B micron-size particles can be used in a like manner. In some embodiments, the micron-size metal particles can be in the form of metal flakes, such as high aspect ratio copper flakes, for example. That is, in some embodiments, the metal nanoparticle compositions described herein can contain a mixture of copper nanoparticles and high aspect ratio copper flakes or a mixture of copper nanoparticles and other micron-size copper particles. Specifically, in some embodiments, the metal nanoparticle compositions can contain about 30% to about 97% copper nanoparticles by weight and about 0.01% to about 15% or about 0.1% to about 30% high aspect ratio copper flakes or other micron-size copper particles by weight. The high aspect ratio copper flakes may be in nanoparticle form, according to some embodiments.

Other micron-size metal particles that can be used equivalently to high aspect ratio metal flakes include, for example, metal nanowires and other high aspect ratio particles, which can be up to about 300 microns in length. The ratio of metal nanoparticle to metal nanowires may range between about 10:1 to about 40:1, according to various embodiments. Suitable nanowires may have a length of between about 5 microns and about 50 microns, and a diameter between about 100 nm and about 200 nm, for example.

In some embodiments, nanoscale conductive additives can also be present in the metal nanoparticle compositions. These additives can desirably provide further structural reinforcement and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation. In some embodiments, the nanoscale conductive additives can have a size in at least one dimension ranging between about 1 micron and about 100 microns, or ranging between about 1 micron and about 300 microns. Suitable nanoscale conductive additives can include, for example, carbon nanotubes, graphene, other graphite-type materials, and the like. When present, the metal nanoparticle compositions can contain about 1% to about 16% nanoscale conductive additives by weight, or about 1% to about 10% nanoscale additives by weight, or about 1% to about 5% nanoscale conductive additives by weight.

Additional substances that can also optionally be present in the metal nanoparticle compositions include, for example, flame retardants, UV protective agents, antioxidants, carbon black, graphite, fiber materials (e.g., chopped carbon fiber materials), diamond, cubic BN, and the like.

Metal nanoparticle compositions suitable for use in the present disclosure can be formulated using any of the formulations described hereinabove, including those in which a grain growth inhibitor is further included, particularly a grain growth inhibitor comprising a metal. The grain growth inhibitor may be included in a suitable form such that the grain growth inhibitor is capable of entering grain boundaries following nanoparticle consolidation. If not included in a suitable form, ineffective grain growth inhibition may occur, even if the grain growth inhibitor otherwise comprises a substance that is capable of providing grain growth inhibition.

In particular embodiments, metal nanoparticle compositions suitable for use in the disclosure herein may comprise copper nanoparticles and a suitable amount of a grain growth inhibitor to prevent substantial grain growth upon heating of a bulk copper matrix formed from the copper nanoparticles. Various CTE modifiers may be present as well. The suitable amount of the grain growth inhibitor and/or CTE modifier may range from about 0.01 wt. % to about 15 wt. % of the composition, according to various embodiments. Effective temperature ranges over which the grain growth inhibitor may inhibit grain growth are considered below.

Suitable grain growth inhibitors may be metal particles that are insoluble in a copper matrix. Suitable grain growth inhibitors may be foreign nanoparticles that are in the 25 nm and under size range or about 10 nm and under size range. Grain growth inhibitors comprising a metal, particularly metal nanoparticles having a size of about 25 nm or under or about 10 nm or under, may be particularly desirable for inclusion in a bulk copper matrix. The small nanoparticle size allows the grain growth inhibitors to access the grain boundaries readily. Inclusion of the grain growth inhibitors limits grain growth by interface or Zener pinning and ensures that the nano-grain structure is retained even after prolonged exposure to high temperatures, frequent temperature cycling, and thermal shock. These actions may prevent further atom diffusion and reorganization.

Suitable metals for a grain growth inhibitor may include, for example, Fe, Mn, Cr, Co, Ru, Si, V, W, Nb, Ta, Y, Zr, Hf, Be, TI, Rh, Ir, Ti, Mo, Re, Al, alloys thereof, or any combination thereof, particularly nanoparticles comprising one or more of these metals. Si is considered to be a metal for purposes of the present disclosure. The metal particles may be metal nanoparticles or micron-size metal particles, according to various embodiments. Nanoparticles of these metals may be particularly suitable. Other suitable grain growth inhibitors may include, for example, carbides, nitrides, borides, silicides, or phosphides. Suitable borides may include, for example, Zr/Hf, V, or Nb/Ta. Similar metals may be appropriate for carbides, nitrides, silicides and phosphides, although any of the metals above may be suitable. Other suitable phosphides may include covalent phosphides such as BP and $SiP_2$, transition metal phosphides such as $Fe_3P$, FezP, $Ni_2P$, CrP, MnP, MoP and the like. Metal-rich phosphides such as these may be desirable due to their water insolubility, electrical conductivity, high melting points, thermal stability, hardness, and similar properties. Other suitable carbides may include covalent carbides such as BC (including $B_xC_y$ non-stoichiometric carbides) and SiC, and transition metal carbides, which similarly exhibit high melting points, hardness, electrical conductivity, and similar properties. Graphene and other nanocarbon materials may also be effective grain growth inhibitors in some cases.

Suitable grain growth inhibitors may be included in copper nanoparticle paste compositions in an amount ranging between about 0.01 wt. % to about 15 wt. % with respect to the composition or in a bulk copper matrix resulting therefrom. In more particular embodiments, the grain growth inhibitors may be present in an amount ranging between about 0.01 wt. % and about 5 wt. %, or between about 0.1 wt. % and about 0.5 wt. %. Particular copper nanoparticle compositions may comprise up to about 12 wt. % Al, or about 0.01-5 wt. % Zr, or 0.01-5 wt. % Zr/Hf. These particular grain growth inhibitors in the referenced amounts may provide temperature stability of up to about 940° C., 500° C. or 600° C., respectively. Aluminum may be advantageous for forming insoluble binary phases like $CuAl_2$ or $Cu_9Al_4$. $Al_2O_3$, including nanoparticles thereof, may also be a suitable grain growth inhibitor and may also impart enhanced oxidation resistance.

The grain growth inhibitors may be in various forms when incorporated/combined with the copper nanoparticles. In some embodiments, the grain growth inhibitors may be nanoparticles themselves, particularly having a size of about 25 nm or less or about 10 nm or less. In other embodiments, the grain growth inhibitors may range between 10 nm and 100 nm in size or between about 25 nm and about 100 nm in size.

When incorporated as nanoparticles, reagents for forming the grain growth inhibitors may be mixed with the reagents for forming the copper nanoparticles (or other types of metal nanoparticles) and then they may undergo co-reduction to form the copper nanoparticles and the grain growth inhibitors simultaneously. Suitable reagents for forming the grain growth inhibitors may include, for example, metal nitrates, chloride, bromides or iodides. The grain growth inhibitors may also constitute nanoparticle seeds for the copper nanoparticles (or other metal nanoparticles), and then become incorporated within the resulting bulk copper matrix following copper nanoparticle fusion. Nanoparticle seeds suitable for becoming a grain growth inhibitor may be made separately and combined with the reagents for forming the copper nanoparticles, or such nanoparticle seeds may be formed concurrently with forming the copper nanoparticles. Carrier solvents may be used to disperse the reagents for forming the nanoparticle seeds/grain growth inhibitors before dispersal with the copper nanoparticles or precursors to the copper nanoparticles.

Alternately, preformed grain growth inhibitors may be mixed with preformed copper nanoparticles (or other metal nanoparticles), either before or after formulating the copper nanoparticles into a metal nanoparticle composition.

In still other alternative embodiments, a trialkylaluminum compound (e.g., trimethylaluminum) may be incorporated in the metal nanoparticle compositions. The trialkylaluminum may react during copper nanoparticle consolidation to release aluminum or an aluminum compound into the grain boundaries.

Still further alternately, salts that form the grain growth inhibitors following reduction may be mixed within the metal nanoparticle compositions and then undergo reduction to form the grain growth inhibitors during consolidation of the metal nanoparticles. Carrier solvents may be used to promote mixing with the metal nanoparticle compositions.

In still other embodiments, $NaReO_4$ may be formulated into a grain growth inhibitor. This salt is compatible with both aqueous and non-aqueous solvent conditions (including glyme solvent mixtures) and the same amines that may be used in forming copper nanoparticles. Reducing agents such as $NaBH_4$, $CaH_2$, hydrazine, organomagnesium or organosodium compounds, or redAl may be used to affect reduction.

CTE adjustment in the metal nanoparticle compositions or metallization layers resulting therefrom may be accomplished by adding low CTE materials in the form of small particles (e.g., platelets, fibers, wires, and the like in the 0.5-250 micron range) to the metal nanoparticle compositions. Examples include, but are not limited to, diamond, BN, SiC, AlN, graphite, carbon nanotubes, graphene, and the like. Preferably, CTE adjustment may be accomplished with materials having high thermal conductivity, but silica and other oxides with negative thermal expansion may be suitable as well. The addition of micron-size metal particles allows the adjustment upwards. High aspect ratio particles may further help increase mechanical strength. CTE adjustment, also referred to as CTE matching in the disclosure herein, may refer to two CTE values differing from one another by not more than about 20%, not more than about 15%, not more than about 10%, not more than about 5%, or not more than about 1%.

Accordingly, the present disclosure provides metallized substrates, which may be interposers for incorporation in an electronic component, comprising: a base substrate, a seed layer directly adhered to the base substrate, and a metal layer formed upon at least a portion of the seed layer. The seed layer may comprise a non-conductive matrix material and a plurality of metal particles, and may optionally be electrically conductive. The metal particles within the seed layer may be the same as or different than the metal present within the metal layer. The metal particles within the seed layer may be in a micron-size range or even larger. The size of the metal particles within the seed layer may dictate, at least in part, the thickness of the seed layer, as well as other seed layer properties. In more specific examples, metallized substrates of the present disclosure may comprise: a base substrate; a seed layer directly adhered to the base substrate, the seed layer being mechanically polished and comprising a non-conductive matrix material and a plurality of metal particles, optionally wherein the seed layer is electrically conductive; and a metal layer formed upon at least a portion of the seed layer.

Figure 3:
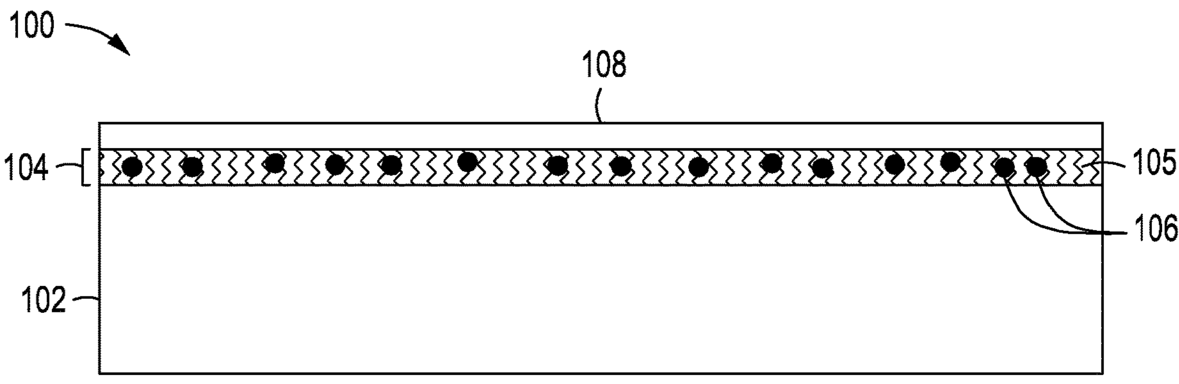
FIG. 3 is a diagram of a metallized substrate of the present disclosure.

FIG. 3 is a diagram of a metallized substrate of the present disclosure. As shown, metallized substrate 100 includes base substrate 102 having seed layer 104 thereupon. Seed layer 104 includes matrix material 105 and metal particles 106 therein. Illustrative examples of matrix material 105, base substrate 102, and metal particle 106 are discussed further herein. Metal layer 108, preferably formed from a metal nanoparticle composition, is deposited upon at least a portion of seed layer 104 and may be CTE-matched thereto. Metal layer 108 may be a metallization layer that is subsequently etched to define conductive traces upon base substrate 102 or conductive traces direct printed upon seed layer 104 using a metal nanoparticle composition. Although seed layer 104 and metal layer 108 have been shown as having a sharp interface between the two, it is to be appreciated that at least partial mixing between seed layer 104 and metal layer 108 may occur, such that there is about a 1-10 micron mixing zone between the two.

Base substrates suitable for use in the present disclosure are not believed to be particularly limited, provided that a seed layer may be satisfactorily adhered thereto upon curing of a seed layer precursor. In non-limiting examples, the base substrate may comprise a ceramic, a polymer, silicon, or glass. In other examples, the base substrate may comprise a metal or metal alloy that the metal layer will not otherwise adhere to without the seed layer being present (e.g., WCu, MoCu, Al, Ni, stainless steel, or the like). Metal substrates may otherwise be difficult to metallize due to their native oxide coating. In more specific examples, the base substrate may comprise a ceramic such as, for example, aluminum nitride, silicon nitride, indium tin oxide, aluminum silicon carbide, or any combination thereof.

AlN (thermal conductivity up to 260 W/m·K) and SiN (thermal conductivity up to 90 W/m·K) are both highly thermally conductive and electrically insulating ceramic substrates, and may be particularly suitable for use in the disclosure herein. By being able to form a metal layer effectively upon AlN or SiN, a three-order-of-magnitude increase in thermal conduction may be realized over that afforded by FR4 and similar glass fiber substrates. Increased thermal tolerance may be realized as well. The high thermal conductivity of these ceramic substrates may promote good heat dissipation within an electronic component, thereby preventing premature burnout and other types of damage that may occur as a consequence of thermal damage in PCB or similar architecture.

Aluminum nitride (AlN) has a hexagonal crystal structure and is a covalent material. The use of sintering aids and hot pressing may be used to produce a dense technical grade material for use as a ceramic substrate. AlN is stable to very high temperatures, especially in inert atmospheres. In air, surface oxidation begins above 700° C. A surface layer of aluminum oxide (5-10 nm in thickness) may form at higher temperatures, which may protect the material up to 1370° C. Above this temperature, bulk oxidation may occur. Aluminum nitride is stable in hydrogen and carbon dioxide atmospheres up to 980° C. The material dissolves slowly in mineral acids through grain boundary attack, and in strong alkalis through attack on the aluminum nitride grains. The material hydrolyzes slowly in water. As such, AlN may be a particularly suitable ceramic substrate for use in the disclosure herein, given its high thermal conductivity and thermal stability under a range of conditions below the melting point of bulk copper.

Although AlN and SiN may be particularly suitable ceramic substrates due to their high thermal conductivity and low cost, other ceramic substrates also may be suitable for use in the disclosure herein. Non-limiting examples of other types of ceramic substrates suitable for use in the present disclosure may include, but are not limited to, cubic BN (130 W/m·K), BeO (330 W/m·K), diamond (2300 W/m·K), BAs (1300 W/m·K), isotopically enriched cubic $^{10}$BN and cubic $^{11}$BN (>1600 W/m·K), Si (148 W/m·K), cubic $C_3N_4$, AlSiC, and the like. AlN and/or SiN may be mixed with any of the foregoing ceramic materials in suitable ceramic substrates as well.

Optionally, one or more vias may extend between first and second faces of the base substrate. The vias may be at least partially filled with a thermally or electrically conductive material, optionally in further combination with a matrix material discussed herein. Blind vias that do not extend fully through the base substrate may be at least partially filled in a similar manner. Blind vias are inclusive of grooves defined in the base substrate.

Any suitable technique may be utilized to form ceramic substrates prior to deposition of a metal layer thereon according to the disclosure herein. Powder compaction or tape casting procedures may be used to form suitable ceramic substrates. Tape casting and use of sintering aids, particularly disappearing sintering aids, may facilitate formation of ceramic substrates having a thickness as low as about 200 microns and in sizes compatible with PCB manufacturing (e.g., 5"×7" sheets). Particularly suitable ceramic substrates may be substantially planar, such that they may be readily stacked in forming a multi-layer PCB.

A coating formulation (seed layer precursor) may be deposited upon the base substrate, followed by curing and depositing a metal layer thereon. The seed layer precursor may comprise a non-conductive matrix material or matrix material precursor and a plurality of metal particles. The non-conductive matrix material may be chosen to promote bonding with the particular type of substrate undergoing metallization according to the disclosure herein. The metal particles within the seed layer precursor may be a plurality of micron-size metal particles, such as copper powder. The matrix material or matrix material precursor may be a liquid glass binder (e.g. a silane, silicate, or similar chemistry), a polymer adhesive such as an epoxy, or any combination thereof. Curing of the matrix material or matrix material precursor may convert the non-conductive matrix material or matrix material precursor from an initially fluid state into a substantially non-fluid state, thereby defining a seed layer physically and/or chemically adhered to the surface of the substrate. In some embodiments, the non-conductive matrix material may bond the metal particles in the seed layer together with one another.

Optionally, the seed layer precursors may further comprise an additive that improves compatibility between the non-conductive matrix material of the seed layer and the metal particles therein, such as through promoting covalent bond formation between the two. The increased interaction between the metal particles and the non-conductive matrix material may help prevent cracking under thermal stress. In some embodiments, the additive may comprise an amino group that may react with a surface of the metal particles and a silane group that may react with the non-conductive matrix material. That is, the additive may serve as a bridging group between the metal particles and the cured non-conductive matrix material. Suitable additives therefore include aminoalkyldialkoxysilanes, aminoalkyltrialkoxysilanes, or any combination thereof. Aminopropyltriethoxysilane (APTES) is a non-limiting example of a suitable additive that may be present.

Suitable techniques for applying the seed layer precursor to the base substrate are not believed to be particularly limited and may include techniques such as, but not limited to, spray on, brush on, dip coating, ink jet printing, stenciling, spin-on coating, or similar application techniques. Unless otherwise indicated, all or a substantial portion of the surface of the base substrate may be coated with the seed layer. Directed deposition techniques for the seed layer precursor may also be suitably used.

The metal particles within the seed layer precursor may be the same as or different than the metal particles in the metal layer. For example, the metal particles within the seed layer precursor and the metal within the metal layer may both comprise copper. The metal within the metal layer may comprise a metal chosen from any of the metal nanoparticle types referenced above, and metal particles within the seed layer precursor may be selected to match or differ from the metal comprising the metal layer.

The amount of non-conductive matrix material or matrix material precursor to metal particles in the seed layer precursor may vary over a wide range. The chosen range may be selected such that the seed layer precursor may be dispensed by a specified application technique. In non-limiting examples, a mass ratio of the metal particles to the non-conductive matrix material or matrix material precursor in the seed layer precursor or seed layer resulting therefrom may range from about 1:1 to about 10:1, or about 2:1 to about 6:1, or about 2:1 to about 5:1, or about 3:1 to about 4:1.

The layer thicknesses of the seed layer after curing may vary over a range of values and may depend upon the size of metal particles present therein. In non-limiting examples, the seed layer may range from about 500 nm to about 50 microns in thickness, or about 1 micron to about 30 microns in thickness, or about 1 micron to about 20 microns in thickness, or about 5 microns to about 30 microns in thickness, or about 1 micron to about 10 microns in thickness. Seed layer thicknesses in the 5-20 micron or 10-30 micron size range may be realized with metal particles having a size of about 1-5 microns, or about 10-12 microns, or about 10-28 microns. Even thicker seed layers may be realized by applying the seed layer precursor to the base substrate multiple times and/or using larger metal particles therein.

In more particular examples, the base substrate may comprise a glass substrate or a ceramic substrate, and the seed layer precursor may comprise a liquid glass binder as the non-conductive matrix material. Suitable liquid glass binders may comprise sodium or potassium silicate in a 40-70% aqueous solution (w/w), optionally including a base (e.g., NaOH, KOH, $Ca(OH)_2$ or the like) and/or 50 nm to 3 micron alumina particles. The silicate concentration in the aqueous solution may be in the 2-50% range by weight, or 2-15% range by weight, or 5-20% range by weight, or 10-30% range by weight, or 15-50% range by weight. Organosilanes or organosilanols may also be suitable in this regard.

In other more particular examples, the base substrate may comprise a ceramic substrate or a metal substrate, and the seed layer precursor may comprise a polymer adhesive, such as an epoxy.

The initially deposited seed layer (after curing) may be an electrical insulator or have low electrical conductivity due to the metal particles being unconnected with one another. That is, the seed layer may comprise a non-conductive seed layer. Surprisingly, the non-conductive seed layer may be converted from an electrical insulator state to an electrical conductor state by mechanical polishing after deposition and curing have taken place to form a polished seed layer. Suitable mechanical polishing may be accomplished by rubbing the non-conductive seed layer with an abrasive material like sandpaper or steel wool. In another example, chemical-mechanical polishing processes commonly used in the electronics industry may be used as an alternative. Without being bound by theory or mechanism, the mechanical polishing process is believed to promote smearing of the grains of metal particles within the seed layer and establishing interconnectivity in between.

Figure 4A:
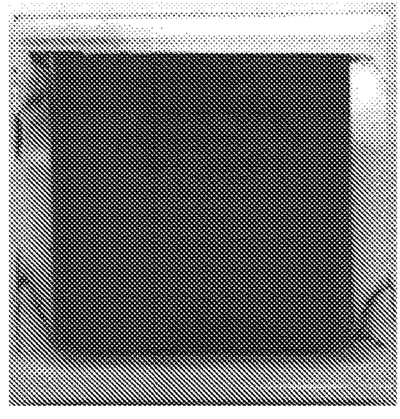
FIGS. 4A and 4B are images of a glass substrate coated with a seed layer containing copper particles before and after polishing, respectively.
Figure 4B:
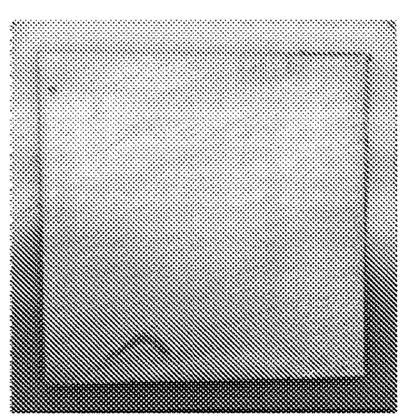
Figure 5:
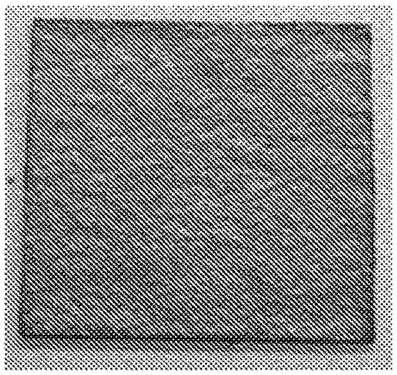
FIG. 5 is an image of a metallized glass substrate.

In addition to promoting electrical conductivity, the physical appearance of the seed layer may be altered following the mechanical polishing operation. For example, FIGS. 4A and 4B are images of a glass substrate coated with a seed layer containing copper particles before and after polishing, respectively. The initially dull appearance of the seed layer becomes much shinier following polishing. FIG. 5 is an image of a metallized glass substrate, which may be prepared as described in further detail below.

Sheet resistivity values within the polished seed layer may be about 500 mOhm/sq or less, or about 400 mOhm/sq or less, or about 300 mOhm/sq or less, or about 200 mOhm/sq or less, or about 100 mOhm/sq for seed layer thicknesses of about 30 microns or higher. At 10 microns or less in thickness, the sheet resistivity may range from about 1-10 Ohm/sq. A copper-containing seed layer having a sheet resistivity of about 100 mOhm/sq is still about 100 times higher than that of bulk copper but still considerably more conductive than conventional materials without mechanical polishing being performed.

In non-limiting examples, the metal layer deposited upon the polished seed layer may have a sheet resistivity of about 1 mOhm/sq or below, or about 0.5 mOhm/sq, or about 0.25 mOhm/sq. For example, a copper-based metal layer may have a sheet resistivity of about 0.15 mOhm/sq for a 300 micron thick layer, and a sheet resistivity of about 0.05 mOhm/sq for a 650 micron thick layer.

Advantageously, the seed layer precursors used herein may be applied to the base substrate and undergo curing without taking inert atmosphere precautions. Depending on the type of non-conductive matrix material used within the seed layer precursor, curing upon the base substrate may take place at various temperatures. In non-limiting examples, sufficient curing of liquid glass matrices may take place at temperatures up to about 100° C., such as about 90° C. to about 100° C. over approximately a 10-15 minute curing time. Polymer adhesives, in contrast, may be cured at temperatures up to about 250° C., but the temperature may range considerably depending upon the type of epoxy resin used.

After mechanical polishing (optionally such that the seed layer is rendered electrically conductive), a metal layer may be deposited upon the polished seed layer using a metal nanoparticle composition. The metal nanoparticle composition may be formulated to facilitate a selected deposition method, ranging from low-viscosity dispersions compatible for spraying, printing, stenciling, or similar applications, to thick pastes suitable for brush-on, doctor blading, or wipe-on type applications for depositing thicker metal layers. The metal layer may be a continuous metallization layer, similar to a bulk copper sheet adhered to the base substrate via the seed layer, or metal traces may be directly printed in a desired pattern upon the polished seed layer using the metal nanoparticle composition. Optionally, a continuous metallization layer deposited in accordance with the foregoing may be partially etched away to define metal traces upon the base substrate. Bonding pads in a desired location upon the base substrate may similarly be formed through etching or direct printing using a metal nanoparticle composition. As indicated above, metal nanoparticle compositions suitable for the foregoing may further feature CTE matching with the base substrate being coated according to the disclosure herein. Moreover, as an alternative, conventional electroplating or electroless plating techniques may be utilized for forming a continuous metallization layer upon the polished seed layer as well.

In some embodiments, forming a metal layer upon the polished seed layer using a metal nanoparticle composition may comprise a hot pressing operation, in which at least a portion of the metal nanoparticles within a metal nanoparticle composition undergo consolidation under the hot pressing conditions. Illustrative hot pressing conditions may include a temperature of about 200° C. to about 270° C. and a pressure of about 500 psi to about 2500 psi. Hot pressing may take place over about 30 minutes to about 90 minutes, although longer or shorter times may also be suitable.

Metals within the metallization layer are not particularly limited and may be any metal that will suitably bond to the polished seed layer. In non-limiting examples, the metal within the metal layer may include, but is not limited to, copper, palladium, gold, or silver.

The thickness of the metal layer (and conductive traces obtained therefrom) may vary over a wide range. In non-limiting examples, the metal layer may be up to about 500 microns in thickness, such as within a range of about 300 microns to about 500 microns, or about 100 microns to about 400 microns, or about 10 microns to about 100 microns.

Embodiments disclosed herein include those of the following clauses:

A. Metallized substrates. The substrates comprise: a base substrate; a seed layer directly adhered to the base substrate, the seed layer being mechanically polished and comprising a non-conductive matrix material and a plurality of metal particles, optionally wherein the seed layer is electrically conductive; and a metal layer formed upon at least a portion of the seed layer. Optionally, the metal layer may be CTE matched with the base substrate.

B. Processes for metallizing a base substrate. The processes comprise: providing a base substrate; applying a seed layer material to the base substrate; wherein the seed layer material comprises a matrix material and a plurality of metal particles; curing the seed layer material on the base substrate to form a non-conductive seed layer adhered to the base substrate; mechanically polishing the non-conductive seed layer to form a polished seed layer, optionally wherein the polished seed layer is electrically conductive; and forming a metal layer upon at least a portion of the polished conductive seed layer.

C. An interposer, interconnect, package substrate, or chip comprising the metallized substrate of A.

D. An interposer comprising the metallized substrate of A, wherein the base substrate comprises aluminum nitride or silicon nitride, and the non-conductive matrix material comprises a liquid glass binder or a polymer adhesive.

Embodiments A-C may have one or more of the following additional elements in any combination:

Element 1: wherein the base substrate comprises a ceramic, a polymer, silicon, or glass.

Element 2: wherein the base substrate comprises a ceramic selected from the group consisting of aluminum nitride, silicon nitride, indium tin oxide, and any combination thereof.

Element 3: wherein the non-conductive matrix comprises a material formed from a liquid glass binder, a polymer adhesive, or any combination thereof.

Element 4: wherein the base substrate comprises glass or a ceramic, and the non-conductive matrix comprises a material formed from a liquid glass binder.

Element 5: wherein the base substrate comprises a ceramic or a polymer, and the non-conductive matrix comprises a polymer adhesive.

Element 6: wherein the metal particles comprise copper particles.

Element 7: wherein the metal layer comprises copper.

Element 8: wherein the metal layer is CTE-matched to the base substrate.

Element 9: wherein the metal layer comprises a continuous metallization layer or one or more metal traces.

Element 9A: wherein the metal layer comprises one or more conductive traces formed by selective etching of the continuous metallization layer.

Element 9B: wherein the metal layer comprises one or more conductive traces formed by selectively depositing a metal nanoparticle composition on the conductive seed layer.

Element 10: wherein the conductive seed layer has a thickness ranging from about 500 nm to about 50 microns.

Element 11: wherein the metal layer has a thickness of about 100 microns to about 2000 microns.

Element 12: wherein forming the metal layer upon the conductive seed layer comprises applying a metal nanoparticle composition on the conductive seed layer, and consolidating a plurality of metal nanoparticles within the metal nanoparticle composition.

Element 13: wherein consolidating the plurality of metal nanoparticles takes place by a hot pressing operation.

By way of non-limiting example, exemplary combinations applicable to A-D include, but are not limited to, 1 or 2, and 3, 4, or 5; 1 or 2, and 6; 1 or 2, and 6 and 7; 1 or 2, and 6; 1 or 2, and 7; 1 or 2, and 6-8; 1 or 2, and 8; 1 or 2, and 9, 9A, or 9B; 1 or 2, and 9 and 9A; 1 or 2, and 9 and 9B; 1 or 2, and 10; 1 or 2, and 11; 1 or 2, and 10 and 11; 3 and 6; 3, and 6 and 7; 3 and 6; 3 and 7; 3, and 6-8; 3 and 8; 3, and 9, 9A, or 9B; 3, and 9 and 9A; 3, and 9 and 9B; 3 and 10; 3 and 11; 3, and 10 and 11; 4 or 5, and 6; 4 or 5, and 6 and 7; 4 or 5, and 6; 4 or 5, and 7; 4 or 5, and 6-8; 4 or 5, and 8; 4 or 5, and 9, 9A, or 9B; 4 or 5, and 9 and 9A; 4 or 5, and 9 and 9B; 4 or 5, and 10; 4 or 5, and 11; 4 or 5, and 10 and 11; 6 and 7; 6, 7, and 8; 6 and 8; 6, and 9, 9A, or 9B; 6, and 9 and 9A; 6, and 9 and 9B; 6 and 10; 6 and 11; 6, and 10 and 11; 7 and 8; 7, and 9, 9A, or 9B; 7, and 9 and 9A; 7, and 9 and 9B; 7 and 10; 7 and 11; 7, and 10 and 11; 9 and 9A, and 10; 9 and 9A, and 11; 9 and 9B, and 10; 9 and 9B, and 11; and 10 and 11. 13 and/or 14 may be in further combination with any of the foregoing.

The present disclosure is further directed to the following non-limiting clauses:

Clause 1. A metallized substrate comprising:

a base substrate;

a seed layer directly adhered to the base substrate, the seed layer being mechanically polished to form a polished seed layer and comprising a non-conductive matrix material and a plurality of metal particles, optionally wherein the polished seed layer is electrically conductive; and a metal layer formed upon at least a portion of the polished seed layer.

Clause 2. The metallized substrate of clause 1, wherein the base substrate comprises a ceramic, a polymer, silicon, or glass.

Clause 3. The metallized substrate of clause 2, wherein the base substrate comprises a ceramic selected from the group consisting of aluminum nitride, silicon nitride, indium tin oxide, and any combination thereof.

Clause 4. The metallized substrate of any one of clauses 1-3, wherein the non-conductive matrix material comprises a material formed from a liquid glass binder, a polymer adhesive, or any combination thereof.

Clause 5. The metallized substrate of clause 1 or clause 4, wherein the base substrate comprises glass or a ceramic, and the non-conductive matrix material comprises a material formed from a liquid glass binder.

Clause 6. The metallized substrate of clause 1 or clause 4, wherein the base substrate comprises a ceramic or a polymer, and the non-conductive matrix material comprises a polymer adhesive.

Clause 7. The metallized substrate of any one of clauses 1-6, wherein the metal particles comprise copper particles.

Clause 8. The metallized substrate of clause 7, wherein the metal layer comprises copper.

Clause 9. The metallized substrate of any one of clauses 1-8, wherein the metal layer is CTE-matched to the base substrate.

Clause 10. The metallized substrate of any one of clauses 1-9, wherein the metal layer comprises a continuous metallization layer or one or more metal traces.

Clause 11. The metallized substrate of any one of clauses 1-10, wherein the seed layer has a thickness ranging from about 500 nm to about 50 microns.

Clause 12. The metallized substrate of any one of clauses 1-11, wherein the metal layer has a thickness ranging from about 100 microns to about 2000 microns.

Clause 13. An interposer comprising the metallized substrate of any one of clauses 1-12, wherein the base substrate comprises aluminum nitride or silicon nitride, and the non-conductive matrix material comprises a material formed from a liquid glass binder or a polymer adhesive.

Clause 14. A process comprising:

providing a base substrate;

applying a seed layer precursor to the base substrate;

wherein the seed layer precursor comprises a non-conductive matrix material and a plurality of metal particles;

curing the seed layer precursor on the base substrate to form a non-conductive seed layer adhered to the base substrate;

mechanically polishing the non-conductive seed layer to form a polished seed layer, optionally wherein the polished seed layer is electrically conductive; and forming a metal layer upon at least a portion of the polished seed layer.

Clause 15. The method of clause 14, wherein forming the metal layer upon at least a portion of the polished seed layer comprises:

applying a metal nanoparticle composition on the polished seed layer; and consolidating a plurality of metal nanoparticles within the metal nanoparticle composition.

Clause 16. The method of clause 15, wherein consolidating the plurality of metal nanoparticles takes place by a hot pressing operation.

Clause 17. The method of any one of clauses 14-16, wherein the base substrate comprises a ceramic, a polymer, silicon, or glass.

Clause 18. The method of clause 17, wherein the base substrate comprises a ceramic selected from the group consisting of aluminum nitride, silicon nitride, indium tin oxide, and any combination thereof.

Clause 19. The method of any one of clauses 14-18, wherein the non-conductive matrix material comprises a material formed from a liquid glass binder, a polymer adhesive, or any combination thereof.

Clause 20. The method of any one of clauses 14-19, wherein the metal particles comprise copper particles.

Clause 21. The method of clause 20, wherein the metal layer comprises copper.

Clause 22. The method of any one of clauses 14-21, wherein the metal layer comprises a continuous metallization layer or one or more conductive traces.

Clause 23. The method of clause 22, wherein the metal layer comprises one or more conductive traces formed by selective etching of the continuous metallization layer.

Clause 24. The method of clause 22, wherein the metal layer comprises one or more conductive traces formed by selectively depositing a metal nanoparticle composition on the polished seed layer.

Clause 25. The method of any one of clauses 14-24, wherein the metal particles comprise micron-size metal particles, metal nanoparticles, or any combination thereof.

One or more illustrative embodiments incorporating the features of the present disclosure are presented herein. Not all features of a physical implementation are described or shown in this application for the sake of clarity. It is understood that in the development of a physical embodiment incorporating the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The disclosure herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A metallized substrate comprising:

a base substrate;

a seed layer directly adhered to the base substrate, the seed layer being mechanically polished to form a polished seed layer and comprising a non-conductive matrix material and a plurality of metal particles, optionally wherein the polished seed layer is electrically conductive; and a metal layer formed upon at least a portion of the polished seed layer.

2. The metallized substrate of claim 1, wherein the base substrate comprises a ceramic, a polymer, silicon, or glass.

3. The metallized substrate of claim 2, wherein the base substrate comprises a ceramic selected from the group consisting of aluminum nitride, silicon nitride, indium tin oxide, and any combination thereof.

4. The metallized substrate of claim 1, wherein the non-conductive matrix material comprises a material formed from a liquid glass binder, a polymer adhesive, or any combination thereof.

5. The metallized substrate of claim 1, wherein the base substrate comprises glass or a ceramic, and the non-conductive matrix material comprises a material formed from a liquid glass binder.

6. The metallized substrate of claim 1, wherein the base substrate comprises a ceramic or a polymer, and the non-conductive matrix material comprises a polymer adhesive.

7. The metallized substrate of claim 1, wherein the metal particles comprise copper particles having a size of 1 to 5 microns.

8. The metallized substrate of claim 7, wherein the metal layer comprises copper.

9. The metallized substrate of claim 1, wherein the metal layer is CTE-matched to the base substrate.

10. The metallized substrate of claim 1, wherein the metal layer comprises a continuous metallization layer or one or more metal traces.

11. The metallized substrate of claim 1, wherein the seed layer has a thickness ranging from about 500 nm to about 50 microns.

12. The metallized substrate of claim 1, wherein the metal layer has a thickness ranging from about 100 microns to about 2000 microns.

13. An interposer comprising the metallized substrate of claim 1, wherein the base substrate comprises aluminum nitride or silicon nitride, and the non-conductive matrix material comprises a material formed from a liquid glass binder or a polymer adhesive.

14. A process comprising:

providing a base substrate;

applying a seed layer precursor to the base substrate;

wherein the seed layer precursor comprises a non-conductive matrix material and a plurality of metal particles;

curing the seed layer precursor on the base substrate to form a non-conductive seed layer adhered to the base substrate;

mechanically polishing the non-conductive seed layer to form a polished seed layer, optionally wherein the polished seed layer is electrically conductive; and forming a metal layer upon at least a portion of the polished seed layer.

15. The method of claim 14, wherein forming the metal layer upon at least a portion of the polished seed layer comprises:

applying a metal nanoparticle composition on the polished seed layer; and consolidating a plurality of metal nanoparticles within the metal nanoparticle composition.

16. The method of claim 15, wherein consolidating the plurality of metal nanoparticles takes place by a hot pressing operation.

17. The method of claim 14, wherein the base substrate comprises a ceramic, a polymer, silicon, or glass.

18. The method of claim 17, wherein the base substrate comprises a ceramic selected from the group consisting of aluminum nitride, silicon nitride, indium tin oxide, and any combination thereof.

19. The method of claim 14, wherein the non-conductive matrix material comprises a material formed from a liquid glass binder, a polymer adhesive, or any combination thereof.

20. The method of claim 14, wherein the metal particles comprise copper particles having a size of 1 to 5 microns.

21. The method of claim 20, wherein the metal layer comprises copper.

22. The method of claim 14, wherein the metal layer comprises a continuous metallization layer or one or more conductive traces.

23. The method of claim 22, wherein the metal layer comprises one or more conductive traces formed by selective etching of the continuous metallization layer.

24. The method of claim 22, wherein the metal layer comprises one or more conductive traces formed by selectively depositing a metal nanoparticle composition on the polished seed layer.

25. The method of claim 14, wherein the metal particles comprise micron-size metal particles, metal nanoparticles, or any combination thereof.

26. The metallized substrate of claim 11, wherein the seed layer has a thickness of 5 microns to 30 microns.

* * * * *